United States Patent
Guan et al.

(10) Patent No.: US 8,608,291 B2
(45) Date of Patent: Dec. 17, 2013

(54) PIEZOELECTRIC INKJET PRINTHEADS AND METHODS FOR MONOLITHICALLY FORMING THE SAME

(75) Inventors: Yimin Guan, Lexington, KY (US); Eunki Hong, Lexington, KY (US)

(73) Assignee: Funai Electric Co., Ltd., Osaka (JP)

( * ) Notice: Subject to any disclaimer, the term of this patent is extended or adjusted under 35 U.S.C. 154(b) by 125 days.

(21) Appl. No.: 13/191,558

(22) Filed: Jul. 27, 2011

(65) Prior Publication Data

US 2013/0027477 A1     Jan. 31, 2013

(51) Int. Cl.
*B41J 2/045*        (2006.01)
(52) U.S. Cl.
USPC .................... 347/68; 347/70; 347/71; 347/72
(58) Field of Classification Search
USPC ...................................... 347/68–72
See application file for complete search history.

(56) References Cited

U.S. PATENT DOCUMENTS

| | | | |
|---|---|---|---|
| 5,459,501 A * | 10/1995 | Lee et al. | 347/68 |
| 5,548,314 A | 8/1996 | Okazawa | |
| 5,956,829 A | 9/1999 | Kitahara | |
| 6,629,756 B2 | 10/2003 | Wang | |
| 7,611,231 B2 | 11/2009 | Ito | |
| 2005/0219328 A1* | 10/2005 | Kodama | 347/70 |
| 2006/0038859 A1* | 2/2006 | Sugahara | 347/71 |

* cited by examiner

*Primary Examiner* — Henok Legesse
(74) *Attorney, Agent, or Firm* — Amster, Rothstein & Ebenstein LLP

(57) ABSTRACT

A piezoelectric inkjet printhead is monolithically fabricated on a substrate. The printhead includes a plurality of cavities formed into the substrate, piezoelectric actuators disposed over the top of the cavities, a fluidic structure and an ink supply channel. The piezoelectric actuators are formed over the cavities using a sacrificial material which fills the cavities and is removed after the actuators are formed. The fluidic structure defines pressurizing chambers and channels connected to the ink supply channel. The fluidic structure has a plurality of nozzle holes formed on the top surface. The cavities are connected to either a venting channel formed from the backside of the substrate or a venting chamber formed inside the fluidic structures.

4 Claims, 9 Drawing Sheets

PIEZOELECTRIC INKJET PRINTHEADS AND METHODS FOR MONOLITHICALLY FORMING THE SAME

FIELD OF THE INVENTION

The present invention relates to micro-fluid applications, such as inkjet printing. More particularly, it relates to piezoelectric inkjet printheads and methods of monolithically forming the same.

BACKGROUND

The art of printing images with micro-fluid technology is relatively well known. A permanent or semi-permanent ejection head has access to a local or remote supply of fluid. The fluid ejects from an ejection zone to a print media in a pattern of pixels corresponding to images being printed.

Micro-fluid ejection heads, also known as printheads, may be classified in several categories which include thermal inkjet printheads or piezoelectric inkjet printheads. Thermal inkjet printheads use resistive heating elements to heat liquid ink to form vapor bubbles which force ink droplets onto a media through a nozzle. Thermal inkjet printheads typically use aqueous ink, which is a mixture of water, glycol and pigments (or dyes). Superheated water in aqueous ink favorably provides thermal inkjet printheads with a high initial pressure of about 100 atm. Piezoelectric inkjet printheads, on the other hand, use piezoelectric actuators to form pressure pulses which force ink through a nozzle hole onto a media. Unlike thermal inkjet printheads, piezoelectric inkjet printheads allow the use of a wider range of inks including solvent based inks and UV curable inks. In addition, piezoelectric printheads are advantageous in various applications that require use of heat-sensitive fluids such as in biological and medical printing or dispensing applications. However, piezoelectric printheads are known to be more expensive and more difficult to fabricate compared to thermal inkjet printheads.

Piezoelectric printheads are typically fabricated by complex processes to form pressurizing chambers and fluidic structures. A piezoelectric printhead constructed by stacking and binding several layers together is disclosed, for example, in U.S. Pat. No. 7,611,231. In some practices, piezoelectric actuators are manufactured using a ceramic processing and later combined with the fluidic structures by assembly processes as disclosed, for example, in U.S. Pat. Nos. 5,956,829 and 5,548,314. In one particular application, piezoelectric actuators are fabricated by laminating alternative layers of piezoelectric layers and electrode layers and sintering the layers together. The sintered plate is divided into individual actuator fingers by dicing. The result, however, are actuators that are fragile which need careful handling when assembled with fluidic structures.

U.S. Pat. No. 6,629,756 describes piezoelectric printheads using a thin film piezoelectric layer instead of bulk piezoelectric ceramics or screen printed piezoelectric layers. Usage of a thin film piezoelectric layer eliminates complex processes described previously. However, forming pressure chambers by a deep reactive ion etching (DRIE) and attaching preformed fluidic structures by a bonding process is still required. Although DRIE enables manufacturers to define pressure chambers more accurately than anisotropic silicon wet chemical etching, it is still challenging to create fine pitched and high aspect ratio pressurizing chambers from the back side of a substrate by etching its full thickness. For example, a 360 dpi printhead with a 70.6 um spacing between adjacent nozzles and 50 um wide pressure chamber would only have a 20.6 um wall thickness between two adjacent pressure chambers. Without controlling the chamber wall angle accurately during DRIE, it is challenging to define pressure chambers uniformly on a large wafer. In addition, the process requires an accurate front to backside alignment. These kinds of complex manufacturing processes reduce production yield and increase manufacturing cost of piezoelectric printheads.

Accordingly, a need exists in the art to eliminate complex process steps required to fabricate piezoelectric printheads and prevent piezoelectric printheads from being batch-processed in wafer level. Additional benefits and alternatives are also sought when devising solutions.

SUMMARY

The above-mentioned and other problems become solved by forming piezoelectric actuators and fluidic structures monolithically on a substrate. A piezoelectric printhead includes a substrate defining a cavity. A piezoelectric actuator overlies an open surface of the cavity. Above the piezoelectric actuator is a pressure chamber fluidly connected to an ink supply channel. The cavity underneath the piezoelectric actuator provides ventilation for the printhead and a space for the piezoelectric actuator to bend downward into before bending upward towards the pressure chamber to eject ink upon application of energy.

In one embodiment, a venting channel extends from a backside of a substrate and is fluidly connected to a cavity. The cavity resides underneath a piezoelectric actuator stack. The cavity is thus vented under the piezoelectric actuator via the venting channel. An ink supply channel extends from an underside of the substrate and through the piezoelectric actuator so that the ink supply channel fills the pressure chamber with ink from below the piezoelectric actuator. The piezoelectric actuator is formed over the top of the substrate using a sacrificial material, which is removed after the piezoelectric actuators are formed. A nozzle plate which defines the pressure chamber is constructed by first depositing an organic sacrificial layer over the piezoelectric actuator. The organic sacrificial layer is patterned to define a volume of the pressure chamber. An inorganic layer is then deposited on the top surface of the patterned organic sacrificial layer to form the nozzle plate layer. The ink supply channel and venting channel are etched from the backside of the substrate.

In another embodiment, a venting chamber extends within a piezoelectric printhead. The venting chamber is adjacent a pressure chamber and above a piezoelectric actuator. A cavity lies underneath the piezoelectric actuator. The piezoelectric actuator has a port hole that fluidly connects the venting chamber to the cavity such that the cavity is vented above the piezoelectric actuator via the venting chamber. An ink supply channel extends through a thickness of a nozzle plate layer above the pressure chamber so that the ink supply channel fills the pressure chamber with ink from above the piezoelectric actuator. The fluidic structures are formed using photo-imageable materials. A flow feature layer, which defines perimeters of the pressure chamber and the venting chamber, is formed by spin coating and a photolithography process. The nozzle plate layer is laminated on the top surface of the patterned flow feature layer. A nozzle hole and the ink supply channel are formed on the nozzle plate layer by a photolithography process.

These and other embodiments are set forth in the description below. Their advantages and features will become readily apparent to skilled artisans. The claims set forth particular limitations.

BRIEF DESCRIPTION OF THE DRAWINGS

The accompanying drawings incorporated in and forming a part of the specification, illustrate several aspects of the present invention, and together with the description serve to explain the principles of the invention. In the drawings.

DETAILED DESCRIPTION OF THE ILLUSTRATED EMBODIMENTS

In the following detailed description, reference is made to the accompanying drawings where like numerals represent like details. The embodiments are described in sufficient detail to enable those skilled in the art to practice the invention. It is to be understood that other embodiments may be utilized and that process, electrical, and mechanical changes, etc., may be made without departing from the scope of the invention. The following detailed description, therefore, is not to be taken in a limiting sense and the scope of the invention is defined only by the appended claims and their equivalents. In accordance with the features of the invention, methods and apparatus include piezoelectric printheads for micro-fluid applications, such as inkjet printing, that are monolithically fabricated on a substrate.

Figure 1A:
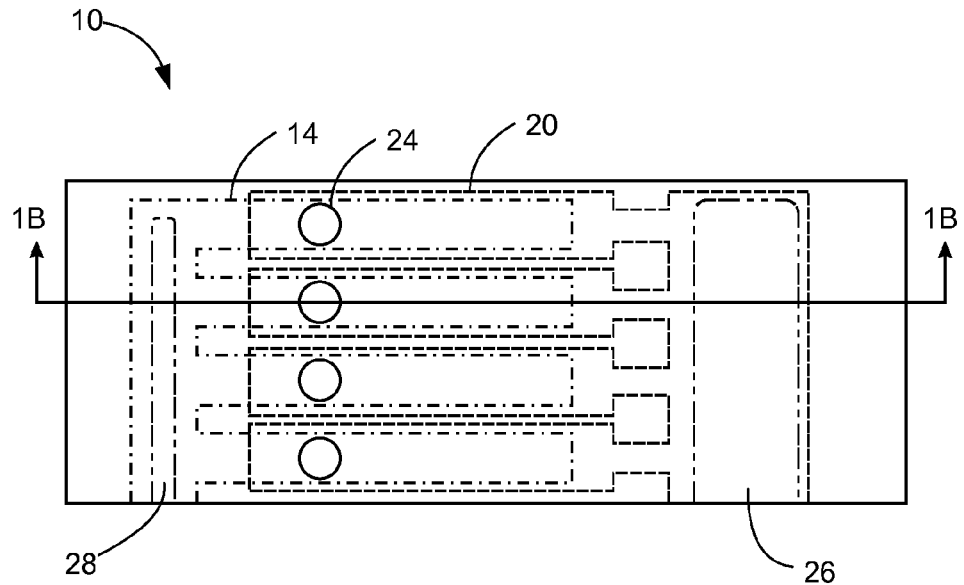
FIG. 1A is a schematic top-view diagram of a piezoelectric printhead according to an example embodiment.
Figure 1B:
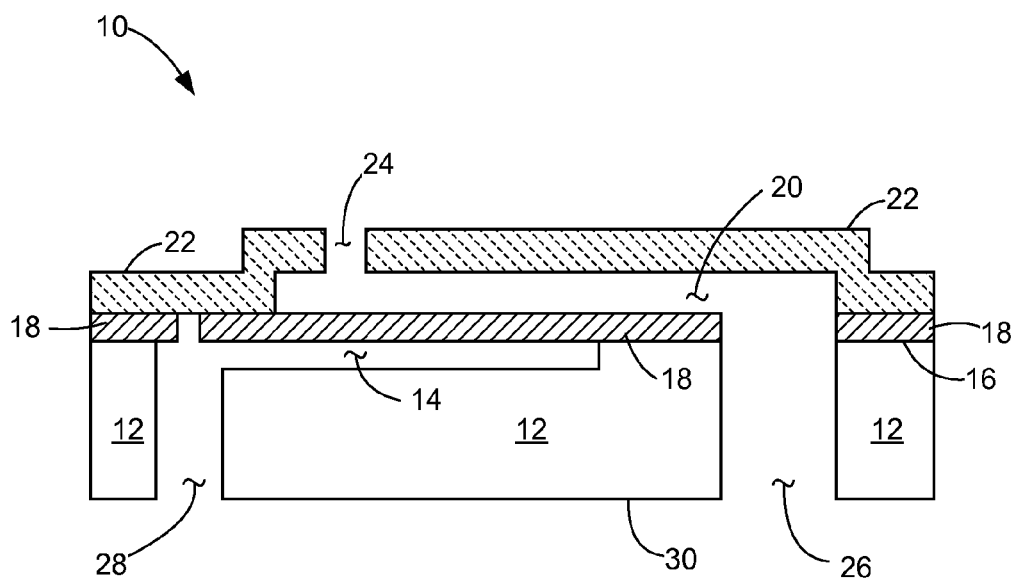
FIG. 1B is a cross-sectional view of the piezoelectric printhead shown in FIG. 1A taken along the cross-sectional lines 1B.

With reference to FIGS. 1A and 1B, piezoelectric printhead 10 includes a substrate 12. The substrate 12 may be made from silicon, or other suitable substrate material. The substrate 12 defines a cavity 14 having an open top surface along the top edge 16 of the substrate 12. The cavity 14 may be formed by patterning a trench on the substrate 12. A piezoelectric actuator 18 is formed over the open top surface of the cavity and underneath a location of a pressure chamber 20. A nozzle plate layer 22 containing nozzle hole 24 is formed above the piezoelectric actuator 18 to define the perimeter of the pressure chamber 20. An ink supply channel 26 and a venting channel 28 are etched from a backside 30 of the substrate 12. The ink supply channel 26 provides a passage through which ink is admitted to the pressure chamber 20 from below the piezoelectric actuator 18. The venting channel 28 fluidly connects the cavity 14 to the atmosphere and acts in conjunction with the cavity 14 as a vent for the piezoelectric printhead 10.

Piezoelectric printhead 10 contains a plurality of pressure chambers 20 and associated piezoelectric actuators 18 and cavities 14. The venting channel 28 extends across the width of the substrate 12 so that it provides each of the cavities 14 a common ventilation path to the atmosphere external to the piezoelectric printhead 10. Ink supply channel 26 similarly extends across the width of the substrate 12 and fills each of the pressure chambers 20 with ink supplied from an ink supply container, ink cartridge or remote ink supply. The nozzle plate layer 22 contains a plurality of nozzle holes 24 each of which are in fluid flow communication with a pressure chamber 20.

Figure 2A:
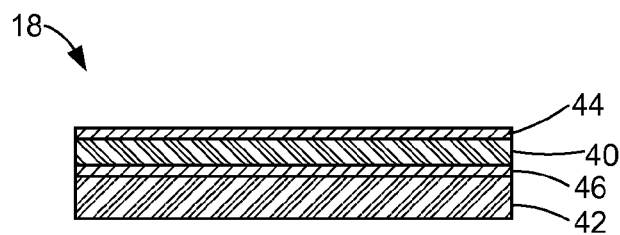
FIGS. 2A and 2B are cross-sectional views illustrating example embodiments of a piezoelectric actuator stack.

Piezoelectric actuators 18 may use two different stack structures. In the first stack configuration shown in FIG. 2A, the piezoelectric actuator 18 consists of a piezoelectric layer 40 and a passive layer 42. The piezoelectric layer 40 is sandwiched between a top electrode 44 and a bottom electrode 46. When an electric field is applied forwardly (the electric field is applied to the direction of the polarization of the piezoelectric layer), the actuator bends downward due to transverse piezoelectric contraction of the piezoelectric layer 40. This configuration is referred to as a $d_{31}$-mode since the contraction is due to $d_{31}$ piezoelectric coefficient of the piezoelectric material. A reverse bias makes the piezoelectric layer expand and results in bending of the stack upward.

The passive layer 42 may be silicon dioxide ($SiO_2$) or silicon nitride ($Si_3N_4$). The preferred layer is $SiO_2$ and may be deposited by low pressure chemical vapor deposition (LPCVD). The piezoelectric layer 40, preferably consisting of a ferroelectric thin film such as a piezoelectric lead zirconate titanate (PZT) ceramic layer, is deposited by a sol-gel process. PZT presents ten times higher piezoelectric coefficients than other commonly known piezoelectric materials such as aluminum nitride (AlN) or zinc oxide (ZnO). For the bottom electrode 46, Ti/Pt, $TiO_2$/Pt or oxide electrodes such as $LaNiO_3$, $RuO_2$ and $IrO_2$ may be used and deposited by sputtering or a sol-gel process, most preferably a 15 nm Ti/120 nm Pt. For the top electrode, Pt, Cr/Au or oxide electrodes may be used. A top electrode consisting of a 100 nm thick Pt is preferred. The thickness of the passive layer 42 ranges from about 0.5 microns to about 2 microns and the thickness of PZT ranges from about 0.5 microns to about 2 microns. The preferred thickness of the passive layer 42 and the piezoelectric layer 40 is 1 micron.

Figure 2B:
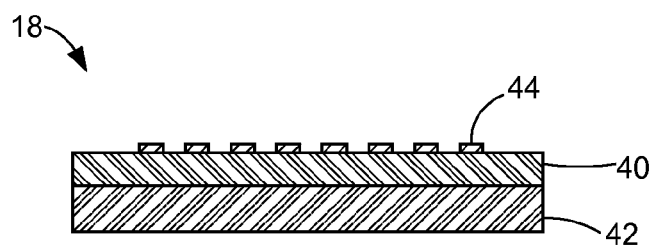
Figure 3A:
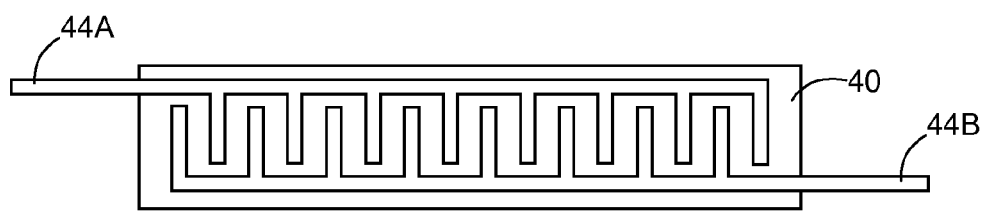
FIGS. 3A and 3B are top-view diagrams illustrating example embodiments of the piezoelectric actuator shown in FIG. 2B.
Figure 3B:
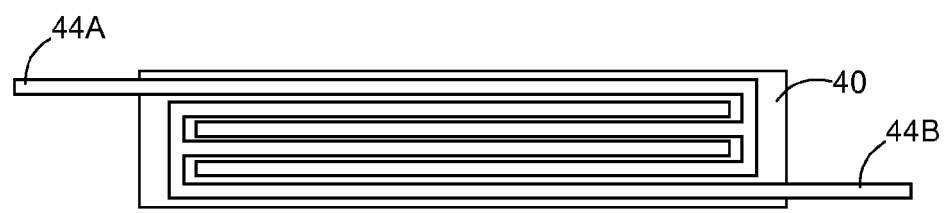

In the second configuration shown in FIG. 2B, a piezoelectric layer 40 is formed on top of a passive layer 42 without a bottom electrode. The top electrode 44 on top of the piezoelectric layer 40 is formed in the shape of an interdigitated electrode (IDE) in which digit-like extensions/fingers interweave as shown, for example, in FIGS. 3A and 3B. The interdigitated electrode is made up by two overlapping metal comb structures 44A and 44B deposited on the piezoelectric layer 40. Each metal comb acts as one electrode. This mode is called IDE due to the shape of the top electrode. In this mode, $d_{31}$ and $d_{33}$ piezoelectric coefficients of the piezoelectric material work together to make the actuator stack deflect. In an IDE mode piezoelectric actuator under a forward bias, a piezoelectric layer perpendicular to IDE fingers expands (due to the $d_{33}$ piezoelectric coefficient) and a piezoelectric layer parallel to the fingers contract (due to the $d_{31}$ piezoelectric coefficient). By changing the shape and spacing of an IDE on the top surface of piezoelectric actuator 18, various deflection shapes can be obtained.

When a lead (Pb) based ferroelectric material such as PZT is used for the piezoelectric layer 40, it may be required to insert a proper barrier layer between the passive layer 42 and piezoelectric layer 40 to prevent Pb diffusion from the piezoelectric layer 40 into the passive layer 42. Useful barrier layers may include $ZrO_2$, $Al_2O_3$ and MgO. These layers may be deposited by sputtering or spin coating. Among these materials, $ZrO_2$ is preferred which may be deposited by a sol-gel process. The thickness of the passive layer 42 ranges from about 0.5 microns to about 2 microns, the thickness of the piezoelectric layer 40 ranges from about 0.5 microns to about 2 microns, and the thickness of the barrier layer (not shown) ranges from about 0.2 microns to about 0.5 microns. The preferred thickness of the passive layer 42, piezoelectric layer 40 and the barrier layer are 0.5 microns, 1 micron, and 0.3 microns, respectively. For the top electrode 44, Pt, Cr/Au or oxide electrodes may be used. Among these electrode materials, Pt is preferred and is patterned to form an IDE using either a lift-off process or dry etching.

Figure 4A:
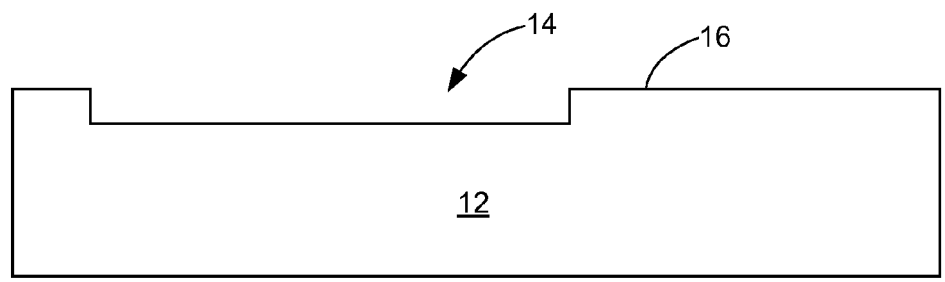
FIG. 4A-4J are partial cross-sectional views illustrating a sequence for making printheads according to the example embodiment shown in FIG. 1B.
Figure 4B:
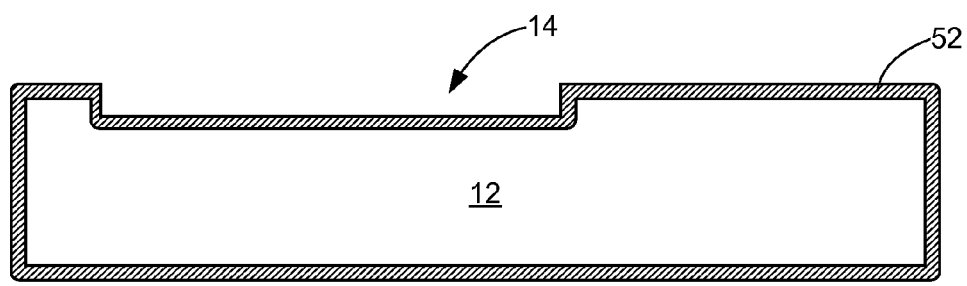

With reference to FIGS. 4A-4J, a preferred method for making printhead 10 will now be described. A silicon wafer providing a substrate 12 is shown in FIG. 4A. A cavity 14 is formed into the substrate 12 by reactive ion etching (RIE). The cavity 14 preferably has a depth from the top edge 16 of the substrate 12 ranging from about 0.5 microns to about 5 microns, most preferably about 4 microns. The width of the cavities 14 and spacing therebetween may depend on the resolution of printhead 10. In order to facilitate dry etching, the patterned substrate 12 is coated with an inorganic passivation layer 52 such as $SiO_2$ and silicon nitride ($Si_3N_4$) as shown in FIG. 4B. A thermally grown $SiO_2$ layer is preferred. The passivation layer 52 may have a thickness of about 1 micron.

Figure 4C:
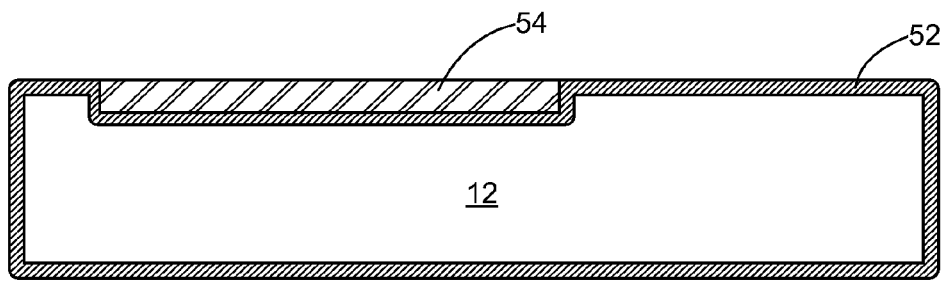

In FIG. 4C, a layer of sacrificial material 54 is deposited into the cavity 14 of the coated substrate 12. Sacrificial material 54 may be an inorganic material such as silicon, germanium, or other metals. Among them, silicon is preferred. An inorganic sacrificial material is favorable since a piezoelectric material such as PZT is deposited at a high temperature of over 600° C. The cavity 14 is completely filled with sacrificial material 54 which may be deposited by sputtering, plasma enhanced chemical vapor deposition (PECVD) or LPCVD. The field sacrificial material around the cavities may be removed by RIE to relax the bending of the substrate 12 especially when only one side of the substrate 12 is deposited with the sacrificial material 54. The sacrificial material 54 is planarized by chemical mechanical polishing (CMP) so that a top surface of the sacrificial material 54 is substantially flush along a top surface of the coated substrate 12.

Figure 4D:
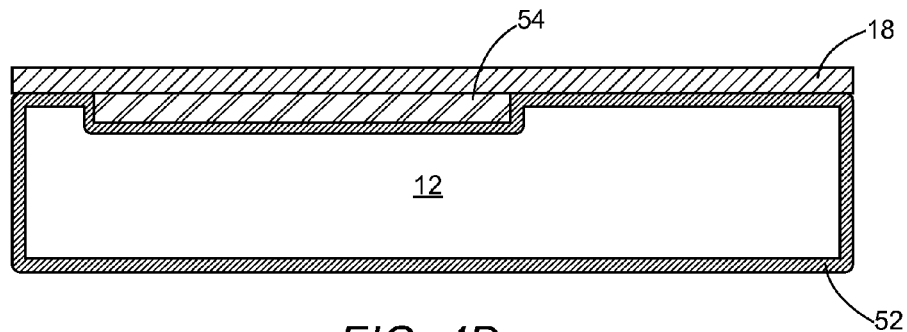

A piezoelectric actuator 18 is formed over the top of the sacrificial material 54 and the coated substrate 12 as seen in FIG. 4D. The piezoelectric actuator 18 may be constructed with two different configurations, $d_{31}$-mode or IDE mode, as previously described. For both modes, the top electrode 44 may be patterned by wet chemical etching or RIE. A protective layer such as $ZrO_2$, or $Al_2O_3$ may be deposited by sputtering or a sol-gel process on top of the actuator stack to protect the piezoelectric actuator 18 from ink. The passivation layer 52 and the sacrificial material 54 act as supporting layers for the piezoelectric actuator 18.

Figure 4E:
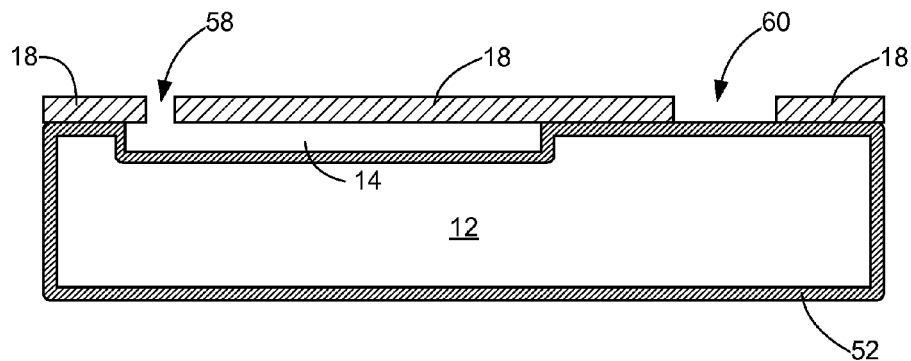

Port holes 58 and 60 are then etched by inductive couple plasma reactive ion etching (ICP RIE) using a mixture of $Cl_2$ and Ar or ion milling (FIG. 4E). The sacrificial material 54 inside the cavity 14 is then removed by a $XeF_2$ release process. The passivation layer 52 serves as an etch stop layer while sacrificial material 54 is removed from the cavity 14.

Figure 4F:
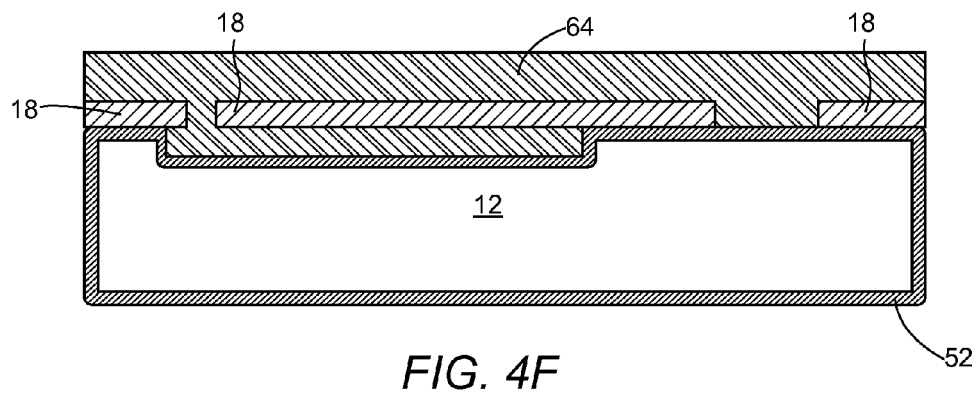

After removing the inorganic sacrificial material 54, the pressure chamber 20 is formed. A sacrificial polymer material 64 is deposited on top of the piezoelectric actuator 18 and is allowed to seep through port hole 58 to fill the cavity 14 (FIG. 4F). Sacrificial polymer material 64 may include a polyimide having a coefficient of thermal expansion of about 3 ppm/° C., such as PI 2600 available from HD MicroSystems. PI 2600 is known for a thermal stability exceeding 400° C. and a coefficient of thermal expansion much lower than most polymers close to that of traditional inorganic substrate materials. It broadens the deposition temperature of the following inorganic layer. To help polyimide flow into the cavities, the sacrificial polymer may be cured at a low pressure oven.

Figure 4G:
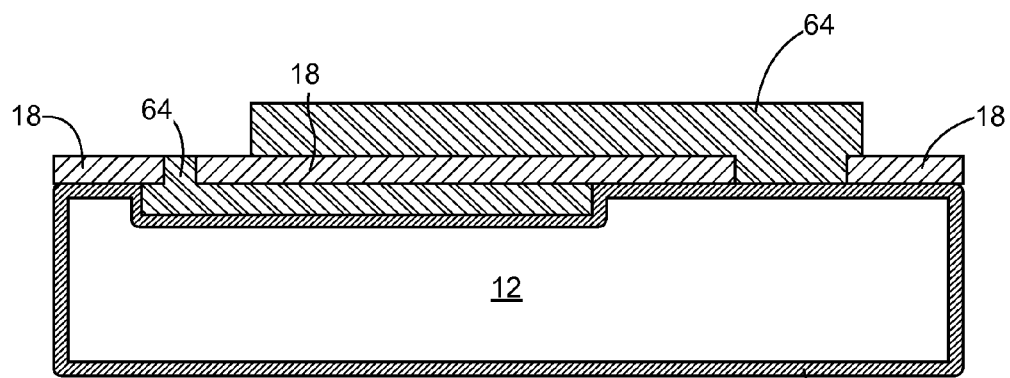
Figure 4H:
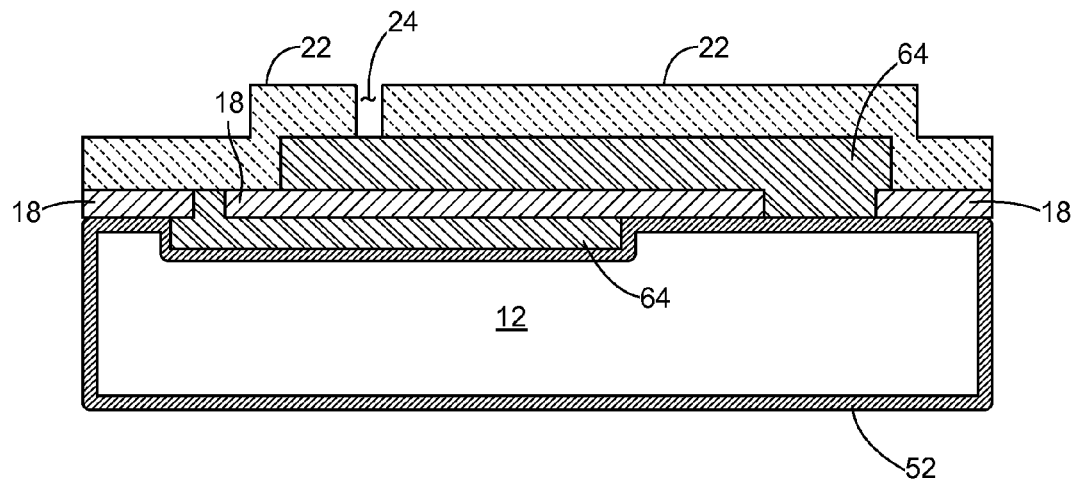

In FIG. 4G, the sacrificial polymer material 64 above the piezoelectric actuator 18 is patterned to define a volume of pressure chamber 20, for example, by reactive ion etching. An inorganic layer is then applied on top of the uppermost layers in the stack shown in FIG. 4G to form nozzle plate layer 22 (FIG. 4H). The inorganic layer may be selected from $SiO_2$, silicon nitride or silicon oxynitride, but $SiO_2$ deposited by PECVD is preferred. A nozzle hole 24 is formed such as by reactive ion etching.

Figure 4I:
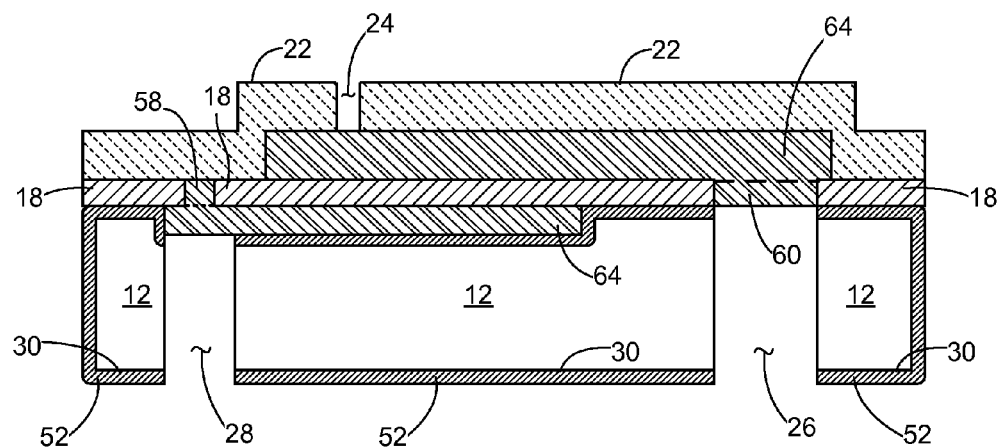
Figure 4J:
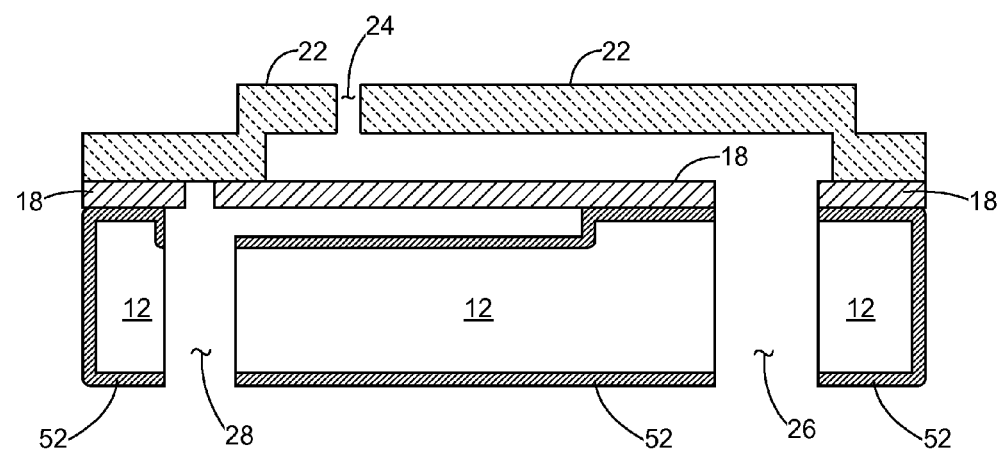

In FIG. 4I, ink supply channel 26 and venting channel 28 are formed from the backside 30 of the coated substrate 12 by deep reactive ion etching. The ink supply channel 26 is etched from the backside 30 directly below the port hole 60 completely through the coated substrate 12 to provide ink flow communication between pressure chamber 20 and ink supply channel 26. Likewise, venting channel 28 is etched completely through the thickness of the substrate 12 from the backside 30 directly below the port hole 58 up to the cavity 14 filled with sacrificial polymer material 64. The sacrificial polymer material 64 both inside the cavity 14 and enclosed by the nozzle plate layer 22 are then removed by a standard oxygen plasma photoresist-ashing process. FIG. 4J illustrates the cross-sectional view of a final piezoelectric printhead fabricated monolithically according to the example embodiment.

Figure 5A:
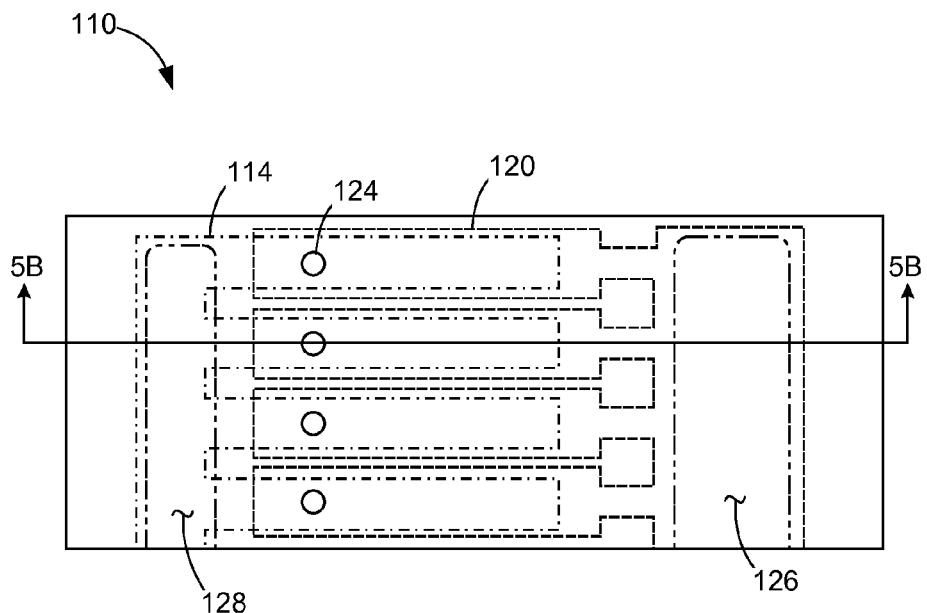
FIG. 5A is a schematic top-view diagram of a piezoelectric printhead according to another example embodiment.
Figure 5B:
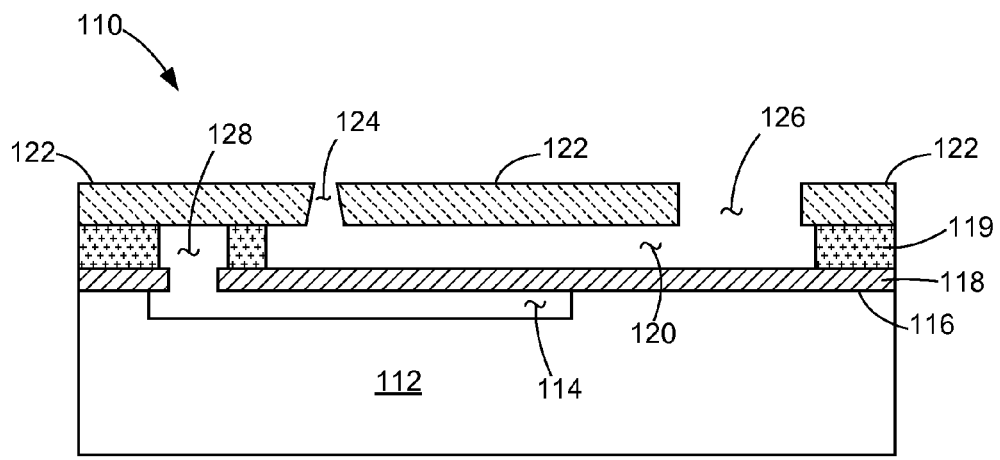
FIG. 5B is a cross-sectional view of the piezoelectric printhead shown in FIG. 5A taken along the cross-sectional lines 5B.

In an alternative embodiment, photoimageable polymers may be used to form fluidic structures instead of an inorganic layer. With reference to FIGS. 5A and 5B, a piezoelectric printhead 110 includes a substrate 112. The substrate 112 defines a cavity 114 having an open top surface along the top edge 116 of the substrate 112. The cavity 114 may be formed by patterning a trench on the substrate 112. A piezoelectric actuator 118 is formed over the open top surface of the cavity 114 and underneath a location of a pressure chamber 120. A flow feature layer 119 defines perimeters of the pressure chamber 120 and a venting chamber 128. A nozzle plate layer 122 is laminated on top of the flow feature layer 119. The nozzle plate layer 122 includes a nozzle hole 124 and an ink supply channel 126 both above the pressure chamber 120. The ink supply channel 126 provides a passage through which ink is admitted to the pressure chamber 120 from above the piezoelectric actuator 118. The venting chamber 128 is formed within the piezoelectric printhead 110 and fluidly connects the cavity 114 to the atmosphere and acts in conjunction with the cavity 114 as a vent for the piezoelectric printhead 110.

Piezoelectric printhead 110 contains a plurality of pressure chambers 120 and associated piezoelectric actuators 118 and cavities 114. The venting chamber 126 extends across the width of the substrate within the piezoelectric printhead 110 to provide each of the cavities 114 a common ventilation path to the atmosphere external to the piezoelectric printhead 110. Ink supply channel 126 similarly extends across the width of the nozzle plate layer 122 and fills each of the pressure chambers 120 with ink supplied from an ink supply container, ink cartridge or remote ink supply. The nozzle plate layer 122 contains a plurality of nozzle holes 124 each of which are in fluid flow communication with a pressure chamber 120.

Figure 6A:
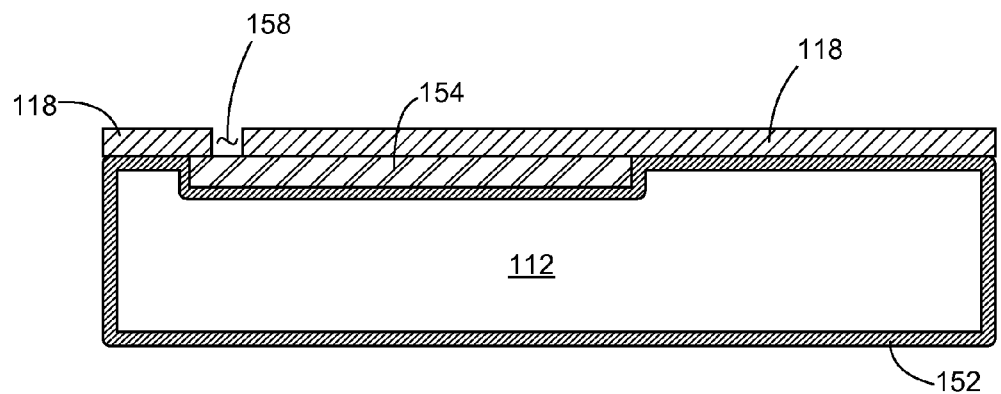
FIG. 6A-6D are partial cross-sectional views illustrating a sequence for making printheads according to the example embodiment shown in FIG. 5A.
Figure 6B:
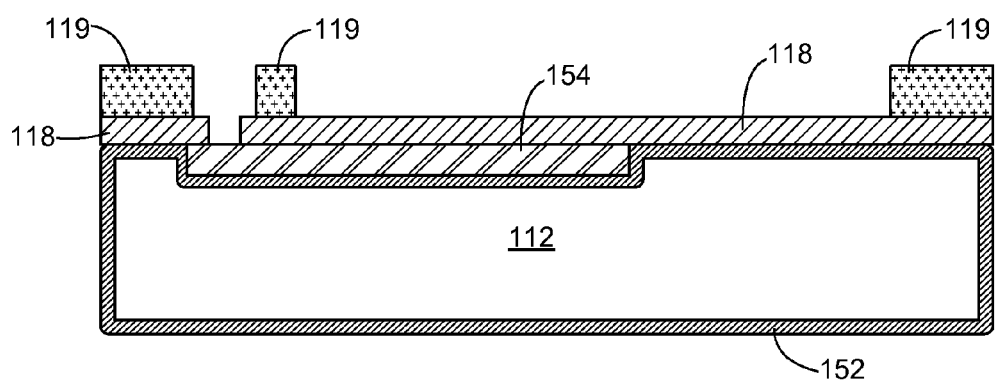
Figure 6C:
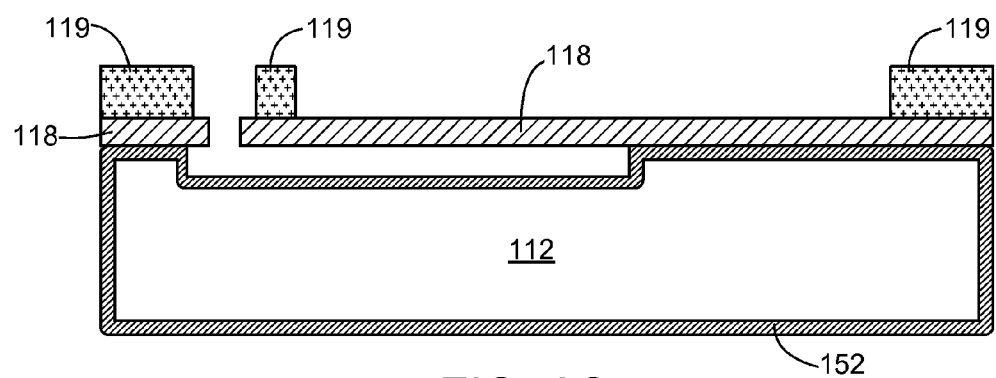
Figure 6D:
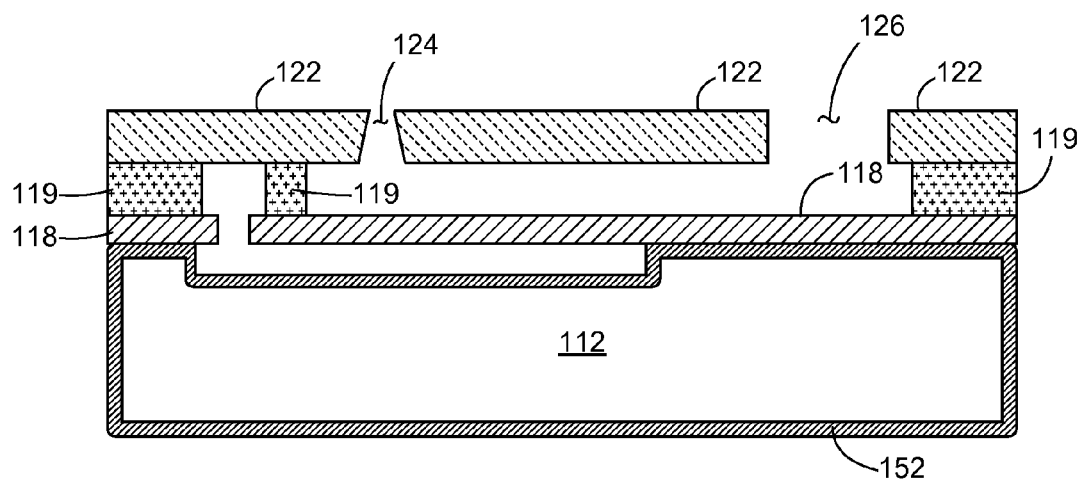
Figure 7:
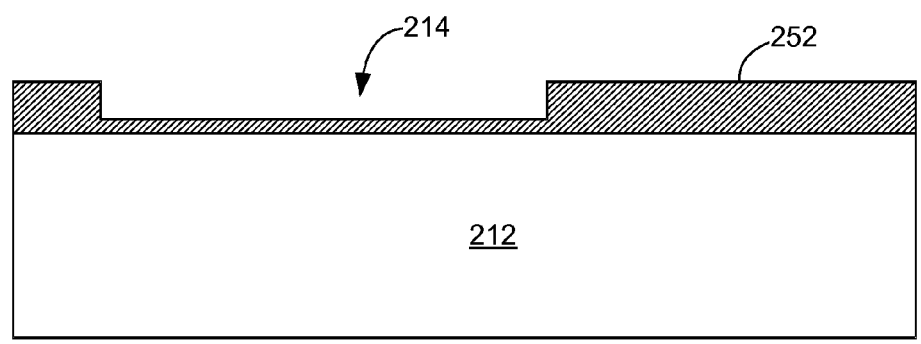
FIG. 7 is a cross-sectional view illustrating an alternative way of forming a cavity on a substrate.

With reference to FIGS. 6A-6D, a preferred method for making printhead 110 will now be described. Piezoelectric printhead 110 is fabricated by initially following the steps associated with FIGS. 4A-4D. After the steps of defining the cavity 114 on the substrate 112, passivating the patterned substrate 112, filling the cavity 114 with inorganic sacrificial material 154, and forming the piezoelectric actuator stack 118, a port hole 158 is etched through the piezoelectric actuator 118 by inductive couple plasma reactive ion etching or ion milling (FIG. 6A). A photoresist layer is deposited on top of the piezoelectric actuator 118 by spin coating and patterned into flow feature structures 119 (FIG. 6B). Thereafter, the inorganic sacrificial material 154 inside the cavity 114 is removed by a $XeFe_2$ process as seen in FIG. 6C. The $XeFe_2$ process selectively etches the sacrificial material 154 without damaging the flow feature structures 119, the piezoelectric layer 118, the passive layer 42 and the top electrode 44. In FIG. 6D, a nozzle plate layer 122 is laminated above the flow feature structures 119 and patterned to form nozzle hole 124 and ink supply channel 126 both directly above the pressure chamber 120. Due to the piezoelectric actuator 118 being released from the substrate 112 and there being no underlying mechanical support in the cavity, a photoimageable dry-film nozzle plate layer is preferred. In this case, a dry-film is attached to the flow feature structures 119 by a lamination process and nozzle hole 124 and an ink supply channel 126 are formed on the dry-film by a photolithography process. FIG. 6D illustrates the final piezoelectric printhead fabricated monolithically according to the second embodiment.

The steps for defining a cavity on a substrate may alternatively be conducted differently from patterning a trench directly on the substrate. In an alternative embodiment, a thick passive layer 252 may be deposited on a substrate 212 and patterned to form the cavity 214 as shown in FIG. 8. The thick passive layer 252 may be one of $SiO_2$, $Si_3N_4$ or silicon oxynitride. Among them, $SiO_2$ is preferred and may be deposited by PECVD, LPCVD or grown by thermal oxidation. It is preferred for the thick passive layer 252 to have a thickness of about 5 microns and the cavity 214 to have a depth of about 4 microns.

Relatively apparent advantages of the many embodiments include, but are not limited to, eliminating complex process steps often required to construct piezoelectric printheads and preventing piezoelectric printheads from being batch-processed in wafer level. Advantages also introduce notions of cavities connected to a venting channel or venting chamber for ventilation, and which provide room where piezoelectric actuators move downward in response to an application of energy.

The foregoing illustrates various aspects of the invention. It is not intended to be exhaustive. Rather, it is chosen to provide the best illustration of the principles of the invention and its practical application to enable one of ordinary skill in the art to utilize the invention, including its various modifications that naturally follow. All modifications and variations are contemplated within the scope of the invention as determined by the appended claims. Relatively apparent modifications include combining one or more features of various embodiments with features of other embodiments.

The invention claimed is:

1. A piezoelectric printhead, comprising:
a substrate comprising a trench formed in the substrate so as to define a cavity;
a piezoelectric actuator overlying an open surface of the cavity;
a pressure chamber above the piezoelectric actuator; and
an ink supply channel fluidly connected to the pressure chamber for filling the pressure chamber with ink;
wherein the cavity underneath the piezoelectric actuator provides ventilation for the piezoelectric printhead and a space for the piezoelectric actuator to bend downward into before bending upward towards the pressure chamber to eject ink upon application of energy, and
wherein the piezoelectric actuator is planar, and wherein the piezoelectric actuator includes port holes fluidly connected to the cavity and the ink supply channel.

2. The printhead of claim 1, further comprising a venting channel extending from a backside of the substrate and fluidly connected to the cavity such the cavity is vented under the piezoelectric actuator via the venting channel.

3. The printhead of claim 1, wherein the ink supply channel extends from an underside of the substrate and through the piezoelectric actuator such that the ink supply channel fills the pressure chamber with ink from below the piezoelectric actuator.

4. The printhead of claim 1, wherein the piezoelectric actuator includes a piezoelectric layer and a passivation layer underneath the piezoelectric layer, the piezoelectric layer either having two electrodes on opposite surfaces thereof or having an upper electrode in the shape of an interdigitated electrode.

* * * * *